(12) United States Patent
Cao

(10) Patent No.: US 6,452,218 B1
(45) Date of Patent: Sep. 17, 2002

(54) ULTRA-THIN ALKALINE EARTH METALS AS STABLE ELECTRON-INJECTING ELECTRODES FOR POLYMER LIGHT EMITTING DIODES

(75) Inventor: Yong Cao, Goleta, CA (US)

(73) Assignee: Uniax Corporation, Santa Barbra, CA (US)

(*) Notice: Subject to any disclaimer, the term of this patent is extended or adjusted under 35 U.S.C. 154(b) by 615 days.

(21) Appl. No.: 08/872,657

(22) Filed: Jun. 10, 1997

(51) Int. Cl.$^7$ .......................... H01L 33/00; H05B 33/06

(52) U.S. Cl. ..................... 257/103; 257/40; 313/503; 313/504

(58) Field of Search ............... 257/40, 103; 313/503, 313/504

(56) References Cited

U.S. PATENT DOCUMENTS

| | | | |
|---|---|---|---|
| 5,047,687 A | | 9/1991 | Vanslyke et al. |
| 5,059,862 A | | 10/1991 | Vanslyke et al. |
| 5,073,446 A | * | 12/1991 | Scozzafava et al. ........ 428/323 |
| 5,151,629 A | | 9/1992 | Vanslyke |
| 5,189,136 A | | 2/1993 | Wudl et al. |
| 5,247,190 A | | 9/1993 | Friend et al. |
| 5,317,169 A | | 5/1994 | Nakano et al. |
| 5,408,109 A | | 4/1995 | Heeger et al. |
| 5,429,884 A | | 7/1995 | Namiki et al. .............. 428/690 |
| 5,512,654 A | | 4/1996 | Holmes et al. |
| 5,626,795 A | | 5/1997 | Cao et al. |
| 5,705,888 A | * | 1/1998 | Staring et al. .............. 313/503 |
| 5,734,225 A | * | 3/1998 | Biebuyck et al. ........... 313/512 |
| 5,747,930 A | * | 5/1998 | Utsugi ........................ 313/504 |

FOREIGN PATENT DOCUMENTS

| | | |
|---|---|---|
| EP | 0 278 757 | 8/1988 |
| EP | 0 468 438 | 1/1992 |
| EP | 0 468 439 | 1/1992 |
| WO | WO 95/24056 | 9/1995 |
| WO | WO 98/10621 | 3/1998 |

OTHER PUBLICATIONS

Berggren et al., 1995, "Controlling Colour by Voltage in Polymer Light Emitting Diodes," *Synthetic Metals*, vol. 71, pp. 2185–2186.

Braun et al., 1991, "Visible Light Emission from Semiconducting Polymer Diodes," *Appl. Phys. Lett.*, vol. 58, pp. 1982–1984.

Braun et al., 1992, "Electroluminescence and Electrical Transport in Poly(3–octylthiophene) Diodes," *J. Appl. Phys.*, vol. 72, pp. 564–568.

Bredas et al., (editors), 1991, *Conjugated Polymers* (Kluwer Academic Publishers, Dordrecht, Netherlands).

Burroughs et al., 1990, "Light–Emitting Diodes Based on Conjugated Polymers," *Nature*, vol. 347, pp. 539–541.

Greenham et al., 1993, "Efficient Light–Emitting Diodes Based on Polymers with High Electron Affinities," *Nature*, vol. 365, pp. 628–630.

Grem et al., 1992, "Realization of a Blue–Light–Emitting Device Using Poly(p–Phenylene)," *Advanced Materials*, vol. 4, pp. 36–37.

Gustafsson et al., 1992, "Flexible Light–Emitting Diodes Made From Soluble Conducting Polymers," *Nature*, vol. 357, pp. 477–479.

(List continued on next page.)

*Primary Examiner*—Allan R. Wilson

(57) ABSTRACT

This invention pertains generally to the field of light-emitting diodes (LEDs). More particularly, this invention relates to polymer LEDs which offer high brightness, high efficiency and extended operating life, and which comprise (a) a transparent hole-injecting anode layer; (b) an emissive layer comprising an electroluminescent polymer; and, (c) an electron-injecting cathode layer; wherein said cathode layer comprises an ultra-thin layer of alkaline earth metal (such as calcium, strontium and barium) having a thickness of about 100 Å or less, typically from about 15 to about 100 Å.

84 Claims, 6 Drawing Sheets

OTHER PUBLICATIONS

Kido et al., 1995, "Single–Layer White Light–Emitting Organic Electroluminescent Devices Based on Dye–Dispersed Poly(N–vinylcarbazole)," *Appl. Phys. Lett.*, vol. 67, pp. 2281–2283.

Parker et al., 1994, "Fabrication of Polymer Light–Emitting Diodes Using Doped Silicon Electrodes," *Appl. Phys. Lett.*, vol. 64, pp. 1774–1776.

Parker et al., 1994a, "Carrier Tunneling and Device Characteristics in Polymer Light–Emitting Diodes," *J. Appl. Phys.*, vol. 75, pp. 1656–1666.

Parker et al., 1994b, "Efficient Blue Electroluminescence From a Fluorinated Polyquinone," *Appl. Phys. Lett.*, vol. 65, No. 10, pp. 1272–1274.

Salaneck et al., 1996, in *Conjugated Polymer Surfaces and Interfaces* (Cambridge University Press, Cambridge), pp. 106–108.

Scott et al., 1996, "Degradation and Failure of MEH–PPV Light–Emitting Diodes," *J. Appl. Phys.*, vol. 79, pp. 2745–2751.

Skotheim, editor, 1986, *Handbook of Conducting Polymers, Vols. 1 and 2* (Marcel Dekker, Inc., New York).

Yang et al., 1993, "A Soluble Blue–Light–Emitting Polymer," *Macromolecules*, vol. 26, pp. 1188–1190.

Yang et al., "Polyaniline as a Transparent Electrode for Polymer Light–Emitting Diodes: Lower Operating Voltage and Higher Efficiency," *Appl. Phys. Lett.*, vol. 64, pp. 1245–1247.

Yang et al., 1995, "Enhanced Performance of Polymer Light–Emitting Diodes Using High–Surface Area Polyaniline Network Electrodes," *J. Appl. Phys.*, vol. 77, pp. 694–698.

Yu, 1996, "High Performance Photonic Devices Made with Semiconducting Polymers," *Synthetic Metals*, vol. 80, pp. 143–150.

Zhang et al., 1993, "Yellow Electroluminescent Diodes Utilizing Poly(2,5–bis(cholestanosy)–1,4–phenylene vinylene)," *J. Electron. Mater.*, vol. 22, pp. 413–417.

Zhang et al., 1994, "Blue Electroluminescent Diodes Utilizing Blends of Poly(p–Phenylene Vinylene) in Poly(9–Vinylcarbazole)," *Synthetic Metals*, vol. 62, pp. 35–40.

* cited by examiner

ULTRA-THIN ALKALINE EARTH METALS AS STABLE ELECTRON-INJECTING ELECTRODES FOR POLYMER LIGHT EMITTING DIODES

TECHNICAL FIELD

This invention pertains generally to the field of light-emitting diodes (LEDs). More particularly, this invention relates to polymer LEDs which offer high brightness, high efficiency and extended operating life, and which comprise (a) a transparent hole-injecting anode layer; (b) an emissive layer comprising an electroluminescent polymer; and, (c) an electron-injecting cathode layer; wherein said cathode layer comprises an ultra-thin layer of alkaline earth metal (such as calcium, strontium and barium) having a thickness of about 100 Å or less, typically from about 15 to about 100 Å.

BACKGROUND

Throughout this application, various publications, patents, and published patent applications are referred to by an identifying citation; full citations for these documents may be found at the end of the specification immediately preceding the claims. The disclosures of the publications, patents, and published patent specifications referenced in this application are hereby incorporated by reference into the present disclosure to more fully describe the state of the art to which this invention pertains.

Diodes and particularly light-emitting diodes (LEDs) fabricated with conjugated organic polymer layers have attracted attention due to their potential for use in display technology. See, for example, Burroughs et al, 1990 and Braun et al., 1991. Among the promising materials for use as active layers in polymer LEDs are poly(phenylene vinylene), PPV, and soluble derivatives of PPV such as poly(2-methyoxy-5-(2'-ethyl-hexyloxy)-1,4-phenylene vinylene), MEH-PPV, a semiconducting polymer with an energy gap $E_g$ of ~2.1 eV. This material is described in more detail in Wudl et al., 1993. Another material described as useful in active layers of polymer LEDs is poly(2,5-bis (cholestanoxy)-1,4-phenylene vinylene), BCHA-PPV, a semiconducting polymer with an energy gap $E_g$ of ~2.2 eV. This material is described in more detail in Zhang et al., 1993. Other suitable polymers include, for example, the poly(3-alkylthiophenes) (see, for example, Braun et al, 1992) and related derivatives (see, for example, Berggren et al., 1995); poly(p-phenylene) (see, for example, Grem et al., 1992), and its soluble derivatives (see, for example, Yang et al., 1993); and polyquinoline (see, for example, Parker et al., 1994a). Blends of conjugated semiconducting polymers in non-conjugated host polymers are also useful as the active layers in polymer LEDs (see, for example, Zhang et al., 1994). Also useful are blends comprising two or more conjugated polymers (see, for example, Yu, 1996). Generally, materials for use as active layers in polymer LEDs include semiconducting conjugated polymers, more specifically semiconducting conjugated polymers which exhibit photoluminescence, and still more specifically semiconducting conjugated polymers which exhibit photoluminescence and which are soluble and processible from solution into uniform thin films.

In the field of organic polymer-based LEDs it has been taught in the art to employ a relatively high work function metal as the anode, this high work function anode serving to inject holes into the otherwise filled π-band of the semiconducting, luminescent polymer. Relatively low work function metals are preferred as the cathode material, this low work function cathode serving to inject electrons into the otherwise empty π*-band of the semiconducting, luminescent polymer. The holes injected at the anode and the electrons injected at the cathode recombine radiatively within the active layer and light is emitted. The common criteria for suitable electrodes are described in detail by Parker et al., 1994b.

Suitable relatively high work function metals for use as anode materials are transparent conducting thin films of indium/tin-oxide (see, for example, Burroughs et al., 1990; Braun et al., 1991). Alternatively, thin films of polyaniline in the conducting emeraldine salt form can be used (see, for example, Gustafsson et al., 1992; Yang et al., 1994; Yang, 1995; and Yang et al., 1995). Thin films of indium/tin-oxide and thin films of polyaniline in the conducting emeraldine salt form are preferred because, as transparent electrodes, both enable the emitted light from the LED to radiate from the device in useful levels.

Suitable relatively low work function metals for use as cathode materials include calcium, magnesium, and lithium. The thickness of the electron injection cathode layer has typically ranged from 200 to 5000 Å (see, for example, Vanslyke, 1992; Friend et al., 1993; Nakano et al., 1994; and Kido et al., 1995). A lower limit of 200 to 500 Å is required in order to form a continuous film (full coverage) for the cathode layer (see, for example, Holmes et al., 1996; Scott et al., 1996; and Parker et al., 1994). In addition to good coverage, thicker cathode layers were believed to provide self-encapsulation to keep oxygen and water vapor away from the active parts of the device.

Alloying of reactive cathode metals with more stable metals, such as aluminum or silver, has been used in attempts to improve the cathode's environmental stability; however, the resulting cathodes remain unstable to reaction with oxygen and/or water vapor (see, for example, Vanslyke, 1991; Vanslyke et al., 1991; and Heeger et al., 1995).

Among the alkaline earth metals, calcium has been widely used in polymer LEDs. Calcium is known to function as an excellent electron-injecting contact. Although strontium and barium have work functions similar to that of calcium, there are no reports in the scientific literature concerning the use of either strontium or barium as cathode materials for polymer LEDs. This is probably due to the higher chemical reactivity of strontium and barium in comparison with calcium. Even calcium is highly reactive, for example, with oxygen and water vapor at room temperature and even more vigorously at elevated temperatures. Consequently, either relatively thick films (>1000 Å) have been used to provide some degree of self-encapsulation or alloys with stable metals, such as aluminum, have been used as cathodes for LEDs, but with only limited success.

Despite in the improvements in the construction of polymer LEDs, a persistent problem has been rapid decay of the device efficiency (and light output) during stress, especially at elevated temperature. Thus, there is a need for low work function cathodes for use as electron-injecting contacts in polymer LEDs, which have improved stability to reaction with oxygen and water vapor especially at elevated temperature.

The inventor has discovered the surprising and unexpected result that a cathode comprising an ultra-thin layer of an alkaline earth metal offers significant improvements in stability (e.g., extended stress lifetime) as compared to conventional cathodes fabricated from the same metals (and other low work function metals) but with films of thickness greater than 200 Å (typically in the range 200 Å to 5000 Å), the latter being known in the art.

Thus, the present invention pertains generally to cathodes comprising an ultra-thin layer (typically about 15 Å to about 100 Å) of an alkaline earth metal (e.g., calcium, strontium and barium), which functions as a stable contact for efficiently injecting electrons into an emissive layer comprising an electroluminescent polymer, thus resulting in LEDs with high brightness, high efficiency and extended operating life.

SUMMARY OF THE INVENTION

The present invention pertains to polymer light-emitting diodes (LEDs) which have extended operating life, and more particularly, LEDs in which the decay of efficiency and light output is substantially postponed.

Thus, one aspect of the present invention pertains to a polymer light-emitting diode (LED) comprising:

(a) a transparent hole-injecting anode layer;

(b) an emissive layer comprising an electroluminescent polymer; and (c) an electron-injecting cathode layer;
wherein said cathode layer comprises an ultra-thin layer of alkaline earth metal having a thickness of from about 15 to about 100 Å.

In one embodiment, the alkaline earth metal is selected from the group consisting of calcium, strontium, and barium.

In another embodiment, the ultra-thin layer of alkaline earth metal has a thickness of from about 30 to about 60 Å.

In another embodiment, the cathode layer further comprises a capping layer. In one embodiment, the capping layer comprises aluminum, silver, or copper.

In another embodiment, the electroluminescent polymer is a conjugated polymer. In one embodiment, the electroluminescent polymer is selected from the group consisting of: poly(p-phenylene vinylene)s, poly(arylene vinylene)s, poly (p-phenylene)s, poly(arylene)s, and polyquinolines. In one embodiment, the electroluminescent polymer is poly(2-(3, 7-dimethyloctyloxy)-5-methoxy-1,4-phenylene vinylene).

In another embodiment, the anode layer comprises a material selected from the group consisting of: metal, metal oxide, graphite, doped inorganic semiconductor, doped conjugated polymer. In one embodiment, the anode layer comprises a material selected from the group consisting of: aluminum, silver, platinum, gold, palladium, tungsten, indium, copper, iron, nickel, zinc, lead, tin oxide, indium/tin oxide, graphite, doped silicon, doped germanium, doped gallium arsenide, doped polyaniline, doped polypyrrole, and doped polythiophene.

In another embodiment, the LED is encapsulated.

DETAILED DESCRIPTION OF THE INVENTION

In one embodiment, the present invention pertains to a polymer light-emitting diode (LED) comprising:

(a) a transparent hole-injecting anode layer;

(b) an emissive layer comprising an electroluminescent polymer; and (c) an electron-injecting cathode layer;
wherein said cathode layer comprises an ultra-thin layer of alkaline earth metal having a thickness of from about 15 to about 100 Å.

Figure 1:
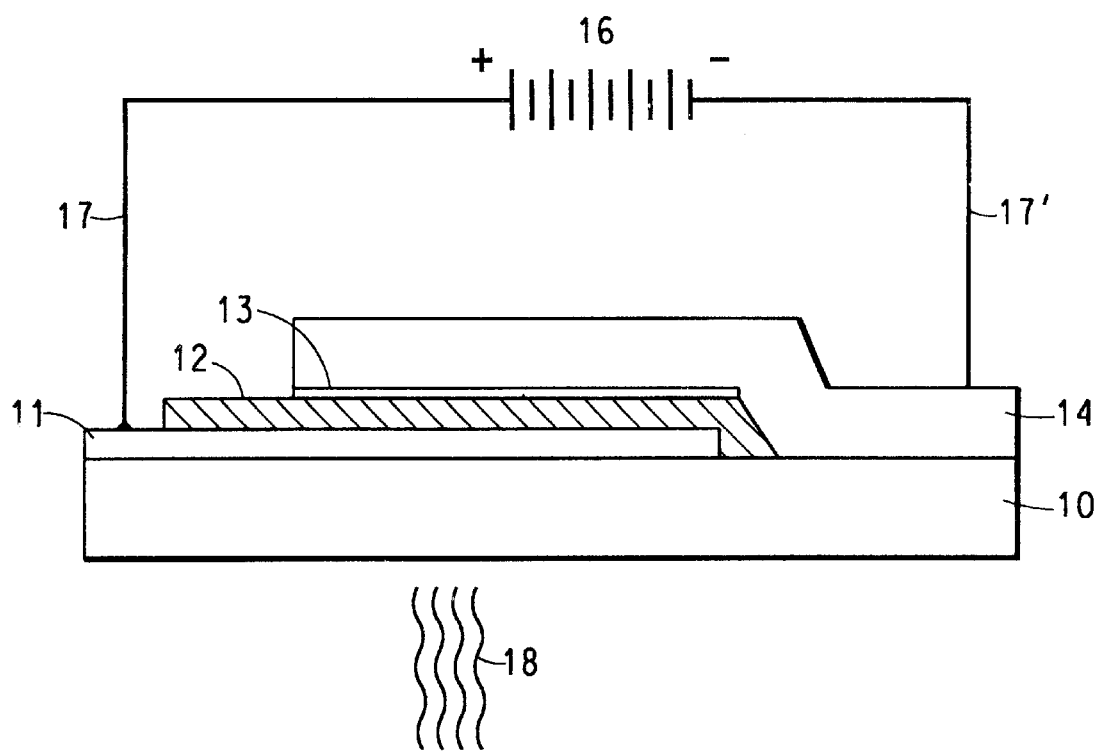
FIG. 1 is a cross-sectional view of typical solid state LED device of the invention (not to scale). 10: substrate; 11: anode; 12: luminescent polymer; 13: ultra-thin layer of alkaline earth metal; 14: capping metal; 16 power source.

A typical example of an LED of the present invention is illustrated in FIG. 1, wherein the cathode is fabricated from an ultra-thin layer of an alkaline earth metal (layer 13 in FIG. 1). In other respects, the LEDs of the present invention are similar to those known in the art. That is, the LEDs of the present invention comprise an emissive layer comprising an active electroluminescent polymer (e.g., an active semiconducting polymer layer) (layer 12 in FIG. 1) sandwiched between an anode layer (layer 11 in FIG. 1) and a cathode layer (comprising an ultra-thin layer of an alkaline earth metal, layer 13 and an optional capping layer, layer 14 in FIG. 1). Other layers known in the art to enhance the performance can also be incorporated, if desired. These include, for example, electron transport layers and/or hole transport layers as described by Greenham et al., 1993; and Zhang et al., 1993.

Cathodes Comprising Ultra-thin Layer of Alkaline Earth Metal

The LEDs of the present invention comprise an electron-injecting cathode layer which comprises an ultra-thin layer of alkaline earth metal having a thickness of from about 15 to about 100 Å.

The term "alkaline earth metal" is used herein in the conventional sense, and refers to metals of Group IIa of the periodic table, including magnesium (Mg), calcium (Ca), strontium (Sr), and barium (Ba). Preferred alkaline earth metals for use in the present invention include calcium, strontium, and barium. The alkaline earth metals are generally low work function metals (i.e., Mg~3.66 eV; Ca 2.7 eV; Sr~2.76 eV; Ba~2.35 eV) (see, for example, Dean, 1982).

In the LEDs of the present invention, the ultra-thin layer of an alkaline earth metal has a thickness of about 100 Å or less, and is typically from about 15 to about 100 Å. In one embodiment, the ultra-thin layer of an alkaline earth metal has a thickness of about 30 to about 60 Å.

The ultra-thin layer of alkaline earth metal can typically be fabricated using any of the techniques known in the art for deposition of thin metallic films, for example, by vacuum evaporation, by sputtering, or by electron beam deposition, using for example, pure metals or alloys. The thickness of the low work function metals can be controlled by time and rate of deposition. Typical rates of deposition were 0.5–2 Å per second.

It is commonly accepted in the semiconducting industry that ultra-thin metal layers with thickness below 100 Å form granules with diameters of several hundred Angstroms.

Typically, on top of the ultra-thin layer of alkaline earth metal, a capping layer of a more stable metal is deposited to provide continuous electrical connection to isolated granules of the ultra-thin alkaline earth metal and to provide a first level of encapsulation. Thus, the surface of the polymer emissive layer need not be completely covered by the ultra-thin layer of the alkaline earth metal; uncovered surface is then contacted with the subsequent capping layer. Examples of suitable more stable metals, which typically are also high work function metals, include aluminum, silver, copper, and the like. The thickness of the capping layer is typically a few hundred Angstroms or greater, and often a few thousand Angstroms. As a result of the capping layer, two signatures are sometimes observed in the current versus voltage (I-V) curves. For example, for a Ca/Al cathode, where Al is the capping material, one signature corresponding to electron injection from Al at ~1.1 V (the work function of aluminum is 4.2 eV) is observed, and a second signature corresponding to electron injection from Ca at ~1.6 V (the work function of calcium is 2.7 eV) is also observed. Typically, however, for Ca/Al cathodes, only one turn-on was observed in the I-V curve at around 1.6 V, indicating minimal discontinuities in the ultra-thin layer of calcium. The latter is preferred.

It is well know that low work function metals, such as alkaline earth metals, can dope conjugated polymers even at room temperature (see, for example, Skotheim, 1986). Salaneck et al., 1996, reported the observation of in situ doping of conjugated oligomers by Ca, which became $Ca^{+2}$ in the interface. Thus, metal granules are homogeneously dissolved into the polymer interface, with the $Ca^{+2}$ serving as the counter-ions in the n-type doped polymer. In this situation, the n-type doped layer of the semiconducting polymer functions as the electron injecting contact. That the n-type doped layer of the semiconducting polymer functions as the electron injecting contact is demonstrated in the Examples below where it is found that the turn-on voltage for Ca and Ba are the same, approximately 1.6 V, although the work function of Ba (2.35 eV) is much lower than the work function of Ca (2.7 eV).

As demonstrated in the Examples below, the stress life of devices with cathodes comprising ultra-thin alkaline earth metals is significantly improved, especially at elevated temperatures, over that of devices with standard thicknesses (e.g., 2000 Å) of alkaline earth metals. Nonetheless, the devices with cathodes comprising ultra-thin low work function metal cathodes exhibit performance (brightness and quantum efficiency) comparable to those of devices with conventional cathodes. As demonstrated in the Examples below, maximum stress life at 85° C. was observed for cathode thicknesses of about 30–40 Å.

The high brightness and quantum efficiency result from the excellent electron injection via the n-type doped layer of the polymer at the interface. On the other hand, it is well known that doping quenches the luminescence of conjugated polymers. When thicker layers of low work function metal are used as the cathode, stress-induced doping causes the doping to extend deeper and deeper into polymer bulk during operation, thereby causing the efficiency and light output to drop during operation.

The Electroluminescent Polymer

In the LEDs of the present invention, the luminescent layer (also referred to as the emissive layer) comprises an electroluminescent polymer. In one embodiment, the electroluminescent polymer comprises at least one conjugated polymer or a co-polymer which contains segments of π-conjugated moieties. Conjugated polymers are well known in the art (see, for example, Bredas et al., 1991). Suitable examples include, but are in no way limited to:

(i) poly(p-phenylene vinylene) and its derivatives substituted at various positions on the phenylene moiety;

(ii) poly(p-phenylene vinylene) and its derivatives substituted at various positions on the vinylene moiety;

(iii) poly(p-phenylene vinylene) and its derivatives substituted at various positions on the phenylene moiety and also substituted at various positions on the vinylene moiety;

(iv) poly(arylene vinylene), where the arylene may be such moieties as naphthalene, anthracene, furylene, thienylene, oxadiazole, and the like;

(v) derivatives of poly(arylene vinylene), where the arylene may be as in (iv) above, and additionally have substituents at various positions on the arylene;

(vi) derivatives of poly(arylene vinylene), where the arylene may be as in (iv) above, and additionally have substituents at various positions on the vinylene;

(vii) derivatives of poly(arylene vinylene), where the arylene may be as in (iv) above, and additionally have substituents at various positions on the arylene and substituents at various positions on the vinylene;

(viii) co-polymers of arylene vinylene oligomers, such as those in (iv), (v), (vi), and (vii) with non-conjugated oligomers;

(ix) poly(p-phenylene) and its derivatives substituted at various positions on the phenylene moiety, including ladder polymer derivatives such as poly(9,9-dialkyl fluorene) and the like;

(x) poly(arylenes) where the arylene may be such moieties as naphthalene, anthracene, furylene, thienylene, oxadiazole, and the like; and their derivatives substituted at various positions on the arylene moiety;

(xi) co-polymers of oligoarylenes such as those in (x) with non-conjugated oligomers;

(xii) polyquinoline and its derivatives;

(xiii) co-polymers of polyquinoline with p-phenylene substituted on the phenylene with, for example, alkyl or alkoxy groups to provide solubility;

(xiv) rigid rod polymers such as poly(p-phenylene-2,6-benzobisthiazole), poly(p-phenylene-2,6-benzobisoxazole), poly(p-phenylene-2,6-benzimidazole), and their derivatives;

and the like.

The luminescent layer can typically be fabricated using any of the techniques known in the art, particularly those methods known in the art of polymer LEDs, including, for example, casting directly from solution, and casting of a polymer precursor followed by reaction (e.g., by heating) to form the desired polymer. Typically, the luminescent layer has a thickness of about 800 to about 1500 Å, more preferably about 1000 Å.

The Transparent Anode Layer

The electroluminescent layer of an LEDs of the present invention is bounded on one surface by a transparent anode layer. When a substrate is present this layer is between the substrate (e.g., deposited on the substrate) and the emissive layer, which comprises conjugated polymer and optionally an additive.

The anode layer is a transparent conductive layer which serves as a hole-injecting layer and which comprises a material with work function above about 4.5 eV. Typical anode materials include metals (such as aluminum, silver, platinum, gold, palladium, tungsten, indium, copper, iron, nickel, zinc, lead, and the like); metal oxides (such as lead oxide, tin oxide, indium/tin-oxide, and the like); graphite; doped inorganic semiconductors (such as silicon, germanium, gallium arsenide, and the like); and doped conducting polymers (such as polyaniline, polypyrrole, polythiophene, and the like). When metals such as those listed above are used, the anode layer must be sufficiently thin to be semi-transparent to the light emitted in the emissive layer. Metal oxides such as indium/tin-oxide and conducting polymers such as polyaniline and polypyrrole are typically semitransparent in the visible portion of the spectrum.

The anode layer can typically be fabricated using any of the techniques known in the art for deposition of thin films, for example, by vacuum evaporation, by sputtering, by electron beam deposition, or by chemical vapor deposition, using for example, pure metals or alloys or other film precursors. Typically, the anode layer has a thickness of about 300 to about 3000 Å.

Encapsulation

Despite the significant improvement in the stress life offered by the cathodes of the present invention, it is typically preferred to encapsulate the polymer LEDs of the present invention to prevent long term degradation. Methods of encapsulation are well known in the art. For example, devices can be sealed between glass plates, or sealed between barrier polymer layers.

EXAMPLES

The remarkable improvement in stability and lifetime of polymer LEDs fabricated with cathodes comprising an ultra-thin layer of alkaline earth metal is illustrated in the Examples below, which are offered by way of illustration and not by way of limitation.

Example 1

LEDs were fabricated using poly(2-(3,7-dimethyloctyloxy)-5-methoxy-1,4-phenylene vinylene) (MDMO-PPV) as the active semiconducting, luminescent polymer. The thicknesses of the MDMO-PPV films were 1000 Å. Indium/tin oxide was used as the anode. The device architecture was ITO/MDMO-PPV/metal. Devices were fabricated using both ITO on glass as the substrate (Applied ITO/glass) and using ITO on plastic, polyethylene terephthalate, PET, as the substrate (Courtauld's ITO/PET). In both cases, ITO was the anode and the hole-injecting contact. Devices were made with ultra-thin layers of calcium (Ca) as the cathode. The metal cathode film was fabricated on top of the MDMO-PPV layer using vacuum vapor deposition at pressures below $1 \times 10^{-6}$ Torr ($1.3 \times 10^{-4}$ Pa) yielding an active layer with area of 3cm². The deposition was monitored with a STM-100 thickness/rate meter (Sycon Instruments, Inc.). Calibration of the actual thickness and thickness distribution in substrate position inside evaporator was made by measuring a 1500 Å aluminum film using a surface profiler (Alpha-Step® 500 Surface Profiler, Tencor Instruments). The thicknesses of the calcium layers were 7, 10, 15, 20, 30, 45, 60, 80, 150, 300 and 2000 Å. Immediately after Ca deposition, a 3000 Å capping layer of aluminum was deposited on top of the calcium layer. For each of the devices, the current versus voltage curve, the light versus voltage curve, and the quantum efficiency were measured. The measured quantum efficiencies of the devices with different thicknesses of calcium as cathode are summarized in Table 1.

TABLE 1

Device performance (at 25 mA) of polymer LED devices prepared with different thicknesses of the calcium cathode

| | | Device Performance at 25 mA | | |
|---|---|---|---|---|
| No. | Ca thickness (Å) | Voltage (V) | Luminance (cd/m²) | Efficiency (%) |
| C150 | 7 | 3.29 | 109 | 2.7 |
| C524 | 15 | 3.25 | 140 | 3.4 |
| C483 | 30 | 3.36 | 121 | 3.0 |
| C527 | 40 | 3.17 | 136 | 3.4 |
| C529 | 80 | 3.14 | 110 | 2.7 |
| C156 | 150 | 3.10 | 116 | 2.9 |
| C286 | 300 | 3.06 | 118 | 2.9 |
| C672 | 3000 | 3.25 | 133 | 3.3 |

This example demonstrates that polymer LEDs with Ca as cathode emit light by electroluminescence, and that the quantum efficiency of the emission is comparable to that for devices with wide range of Ca thickness including ultra-thin layers having thicknesses of less than 100 Å.

Example 2

The devices of Example 1 were encapsulated with a cover glass and a UV curable epoxy (ELC-2500, Electro-Lite Corporation), and stressed at a constant current of 25 mA (current density 8.33 mA/cm²) at 85° C. in an oven under ambient atmosphere. Light output was recorded by a photodiode placed 1 cm above each device. Operating voltage changes were recorded during stress. The change in luminance change during stress, for devices with different Ca thicknesses, is illustrated in FIG. 1.

This Example demonstrates the surprising and unexpected result that the stress life, $\tau_{1/2}$, (the time required for the light intensity to drop to half the initial value), at 85° C. is increased from 50 hours to more than 200 hours. Based on previous experiments, the acceleration factor for stress life at 85° C. in comparison with room temperature stress at the same current density (8.33 mA/cm²) was determined to be 40. This indicates that the room temperature stress half life of the LED will exceed 8,000 hours.

Example 3

Light-emitting diodes were fabricated as in Example 1, but calcium (Ca) was replaced by strontium (Sr) and barium (Ba). Initial device performance data are summarized in Table 2.

TABLE 2

Device performance (at 25 mA) of polymer LED devices prepared with different thicknesses of Barium and Strontium cathodes

| | | | Device Performance at 25 mA | | |
|---|---|---|---|---|---|
| No. | Cathode | Thickness (Å) | Voltage (V) | Luminance (cd/m²) | Efficiency (%) |
| D236 | Ba | 15 | 3.08 | 146 | 3.6 |
| D238 | Ba | 30 | 3.07 | 148 | 3.7 |
| D248 | Ba | 45 | 3.04 | 139 | 3.4 |
| D182 | Ba | 60 | 3.10 | 135 | 3.3 |
| D176 | Ba | 85 | 3.19 | 110 | 2.9 |
| D108 | Ba | 3000 | 3.01 | 131 | 3.2 |
| D148 | Sr | 45 | 2.97 | 117 | 2.9 |
| D111 | Sr | 2000 | 2.95 | 106 | 2.6 |

This example demonstrates that polymer LEDs with Ba and Sr as cathodes emit light by electroluminescence, and that the quantum efficiency of the emission is comparable to that for devices with a wide range of thicknesses. A slightly higher quantum efficiency was obtained for devices comprising Ba in the cathode in comparison with devices comprising Ca or Sr in the cathode.

Figure 2:
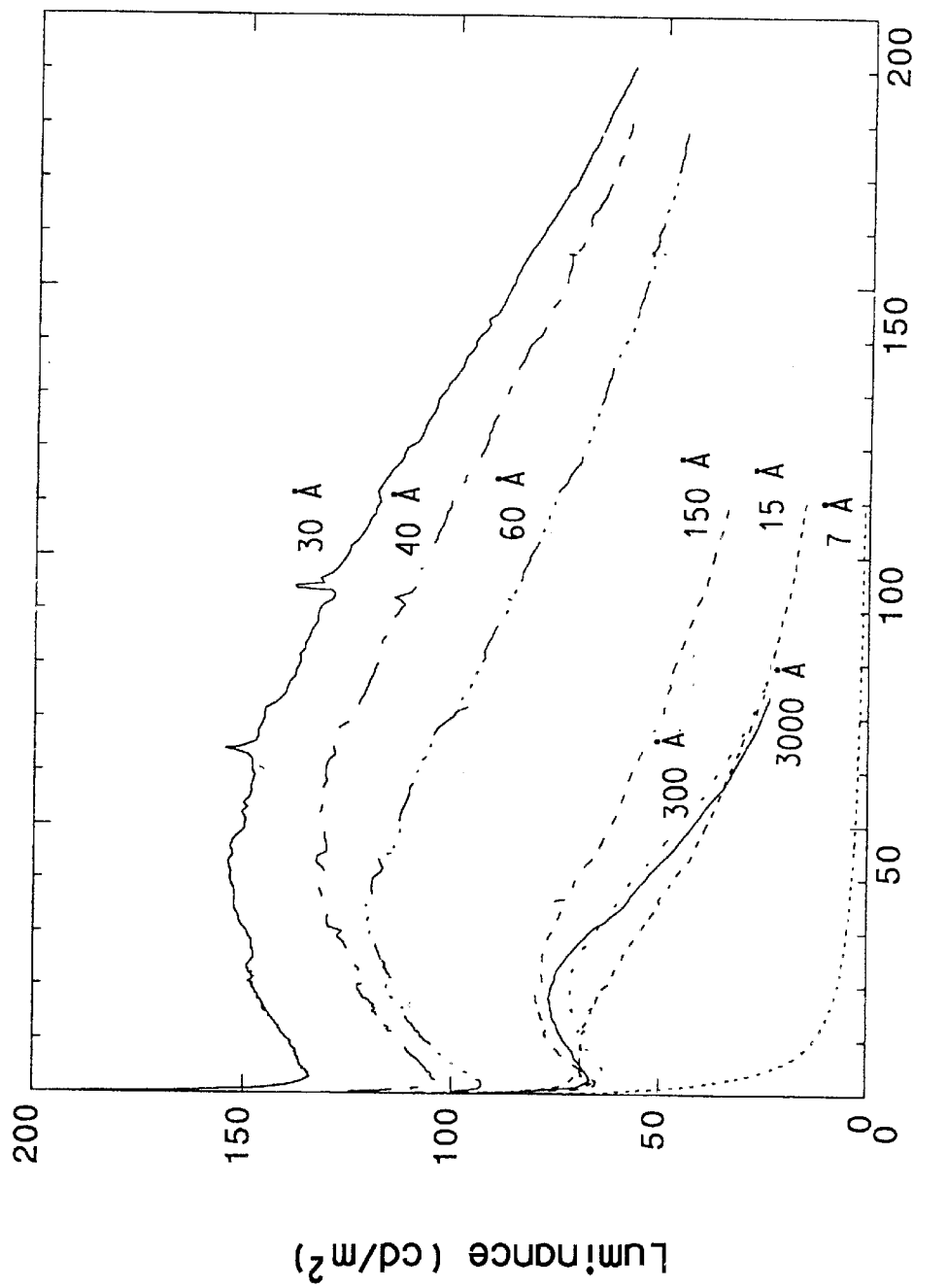
FIG. 2 is a graph of luminance versus time for LED devices with different thickness of a calcium layer during continuous stress at 85° C. and 8.3 mA/cm$^2$.
Figure 3:
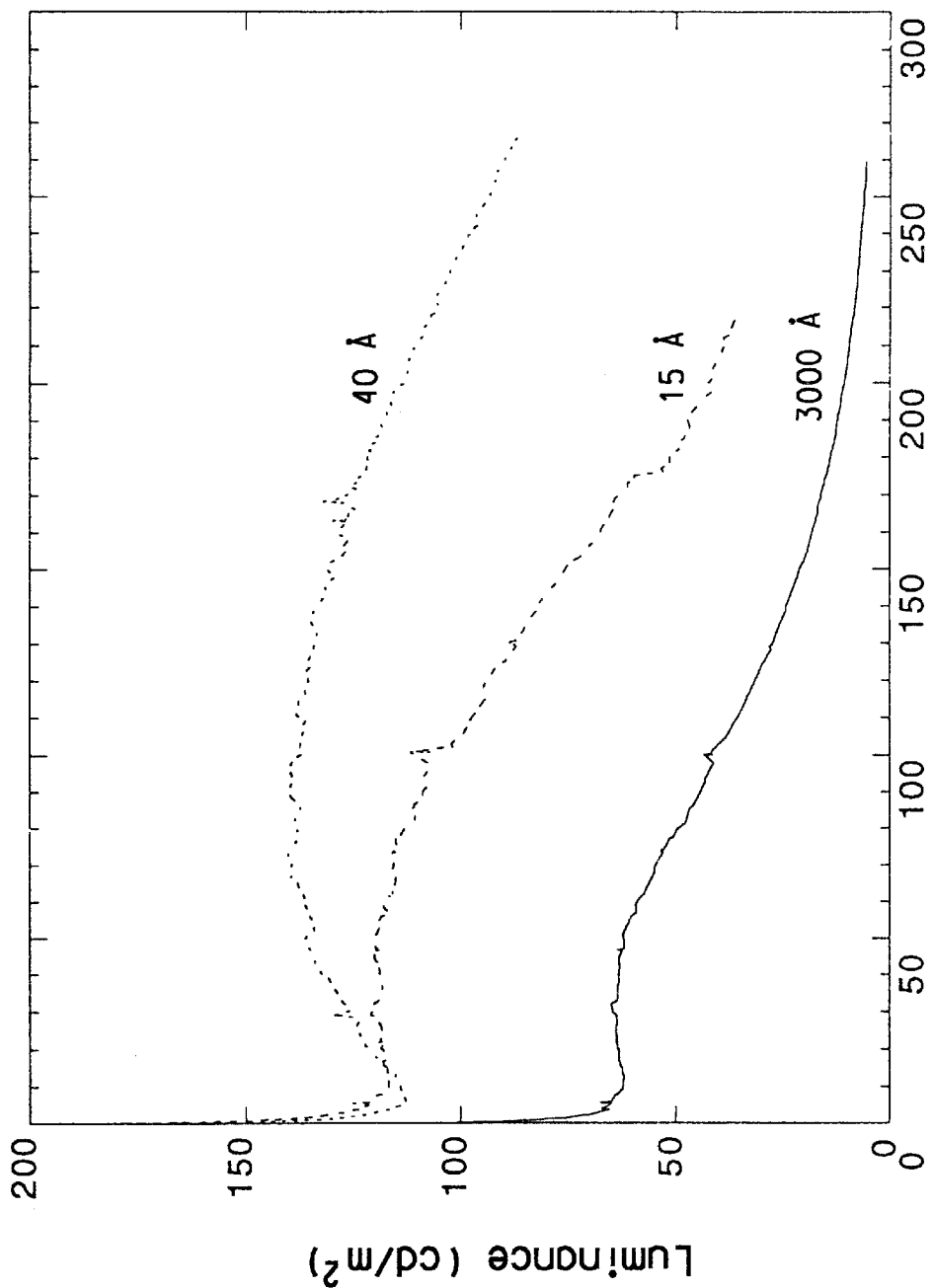
FIG. 3 is a graph of luminance versus time for LED devices with different thickness of a barium layer during continuous stress at 85° C. and 8.3 mA/cm$^2$.
Figure 4:
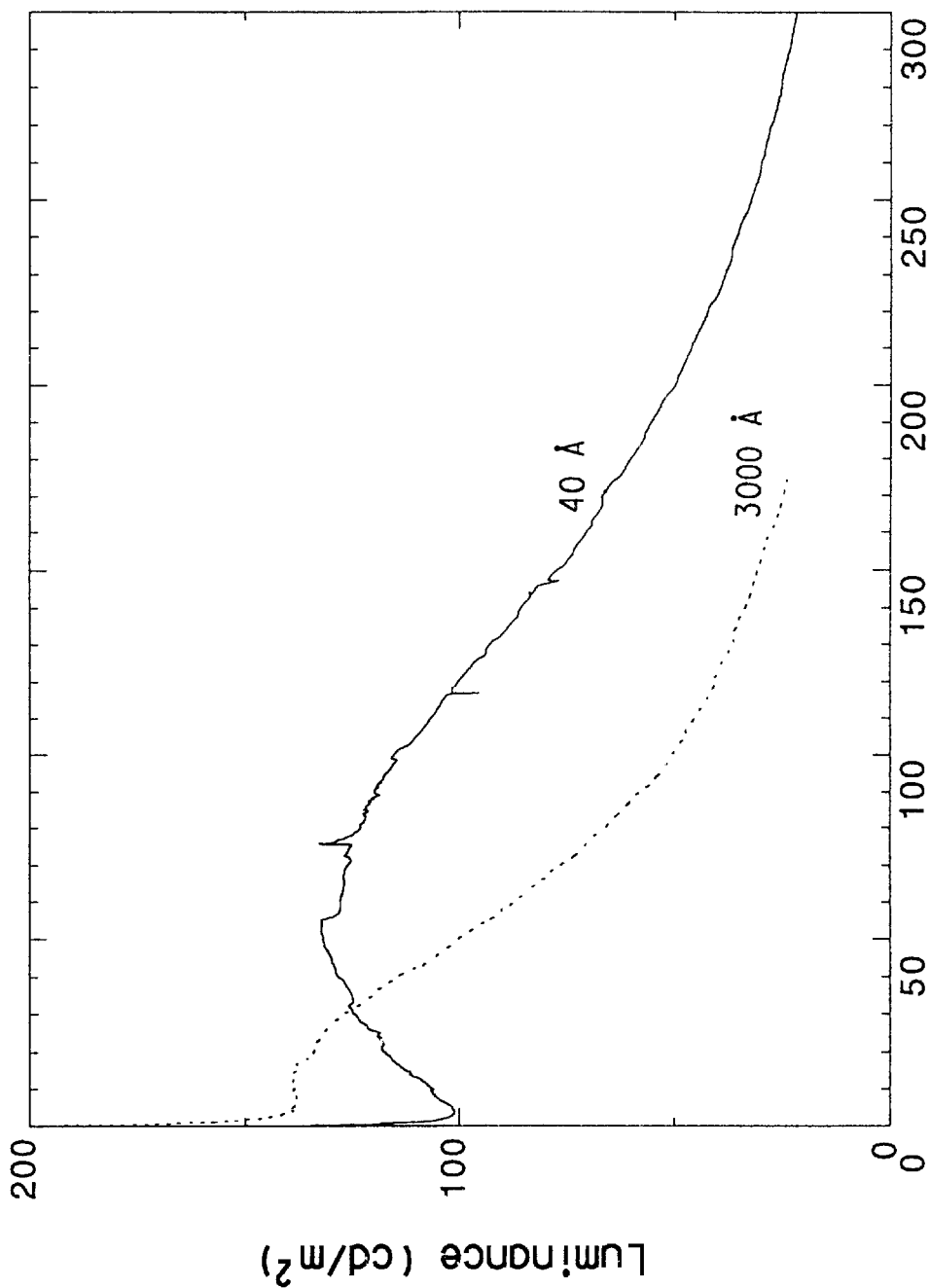
FIG. 4 is a graph of luminance versus time for LED devices with 40 Å and 3000 Å layers of strontium, respectively, as a cathode layer, during continuous stress at 85° C. and 8.3 mA/cm$^2$.

The devices were stressed under the same conditions as described in Example 2. The change in luminance change during stress, for devices with different Ba and Sr thicknesses, is illustrated in FIGS. 3 and 4. The thickness dependence of the stress life for Ba and Ca was similar to that observed for Ca in FIG. 2. Comparing the data in FIGS. 2, 3, and 4, it is evident that cathodes comprising an ultra-thin layer of Ba provide the best stress life. Table 3 summarizes the half life ($\tau_{1/2}$) data for LEDs with different thicknesses of Ca, Sr and Ba in the cathode at 85° C. and 8.33 mA/cm².

TABLE 3

Half stress life of LED devices with different thickness of Calcium, Barium and Strontium cathode at 25 mA

| Cathode | Thickness (Å) | Half-life $\tau_{1/2}$ (h) |
|---|---|---|
| Ca | 7 | 3 |
| Ca | 15 | 57 |
| Ca | 30 | 175 |
| Ca | 40 | 180 |
| Ca | 60 | 175 |
| Ca | 150 | 110 |
| Ca | 300 | 60 |
| Ca | 3000 | 60 |
| Sr | 40 | 200 |
| Sr | 3000 | 80 |
| Ba | 15 | 175 |
| Ba | 40 | >300 |
| Ba | 3000 | 120 |

Figure 5:
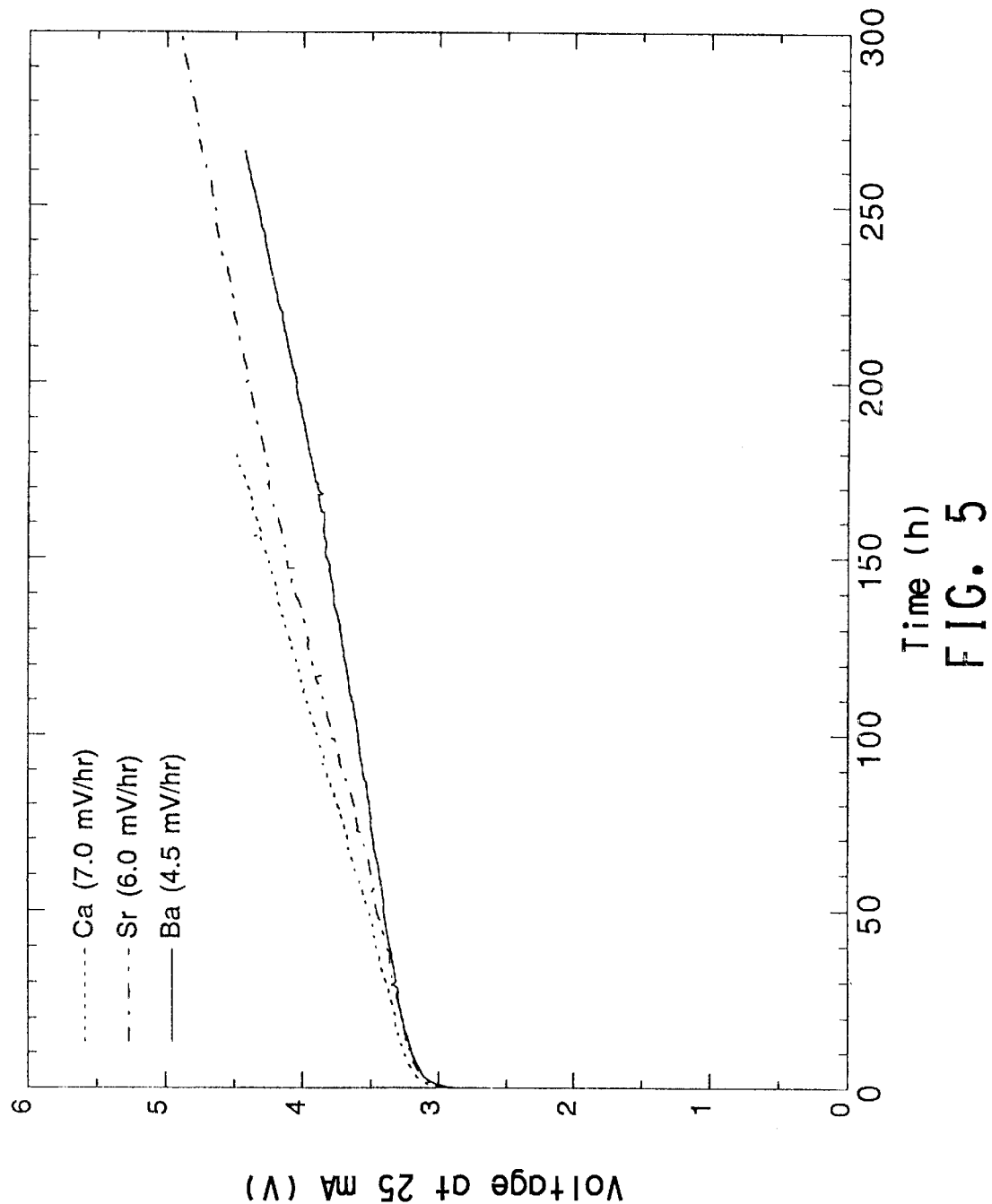
FIG. 5 is a graph of voltage at 25 mA versus time (indicating the voltage increase rate) for LED devices with 40 Å layers of calcium, strontium, and barium respectively, as a cathode layer during continuous stress at 85° C. and 8.3 mA/cm$^2$. The voltage increase rate is indicated in parenthesis.

Furthermore, devices comprising an ultra-thin layer of Ba show a slightly lower rate of voltage increase compared to those comprising ultra-thin layers of Ca or Sr (this is evident from the data in FIG. 5).

This Example demonstrates that of the alkaline earth metals examined, ultra-thin Ba provides the best performance in terms of operating lifetime.

Example 4

Examples 1 and 2 were repeated, but the capping layer was changed from Al to the high work function metals, silver (Ag) and copper (Cu). Device performance data are summarized in Table 4. The data demonstrate that devices with Ag and Cu capping layers are comparable to those obtained with Ca as the cathode and Al as the capping metal (see Table 1). Stress experiments carried out at 85° C. showed a similar thickness dependence for the Ca layer as in the case of Al as capping layer.

TABLE 4

Device performance (at 25 mA) of polymer LED devices prepared with Ag and Cu as capping layers

| | | | Device Performance at 25 mA | | |
|---|---|---|---|---|---|
| No. | Capping Metal | Ca Thickness (Å) | Voltage (V) | Luminance (cd/m²) | Efficiency (%) |
| D655 | Ag | 3000 | 3.33 | 124 | 3.0 |
| D663 | Ag | 40 | 3.36 | 141 | 3.5 |
| D659 | Cu | 3000 | 3.39 | 121 | 3.2 |
| D667 | Cu | 40 | 3.56 | 150 | 3.7 |

This Example demonstrates that a variety of high work function metals can be used as metal capping layers in combination with ultra-thin alkaline earth metals as cathode.

Comparative Example

Figure 6:
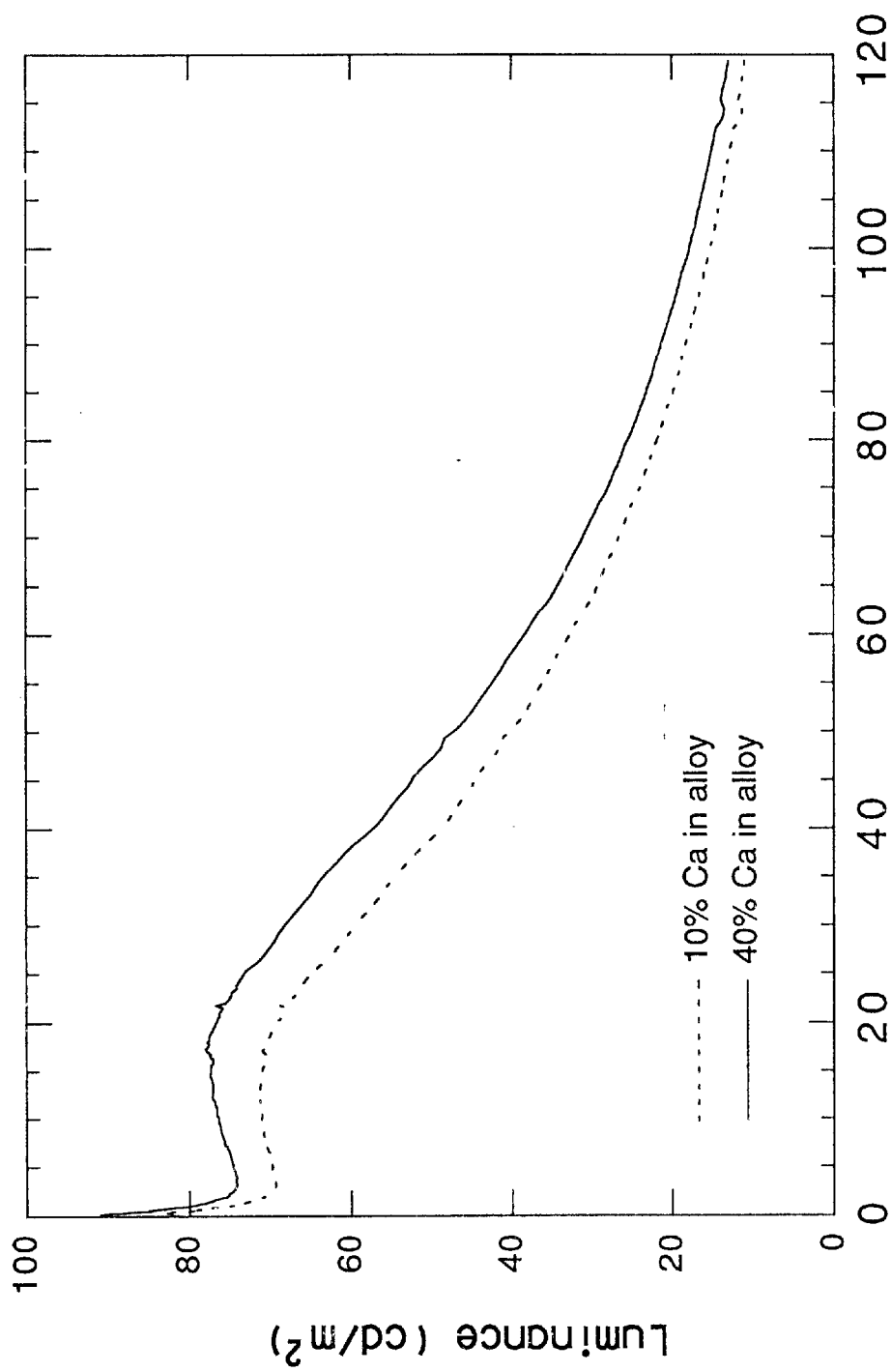
FIG. 6. is a graph of luminance versus time for comparative LED devices having 2000 Å layers of a calcium/ aluminum alloy as a cathode layer, during continuous stress at 85° C. and 8.3 mA/cm$^2$.

Example 1 was repeated, but with 2000 Å of an alloy of calcium and aluminum (with volume ratios of 1:9 and 4:6) as cathodes. This was accomplished by simultaneously vapor depositing Ca and Al from two separate resistively heated tantalum boats. The volume ratio of Ca and Al was controlled by the evaporation rate of the two metals. Pure aluminum (2000 Å) was deposited as the capping layer on top of the alloy layer, as in Example 1. The luminance change versus time during stress at 85° C., as described in Example 2, was measured and is illustrated in FIG. 6. Upon comparing FIGS. 2 and 6, it is evident that devices with Ca/Al alloy cathodes exhibit a stress life at 85° C. comparable to that typically obtained with thick Ca cathodes; that is, around 50 hours.

This comparative Example demonstrates that cathodes comprising an ultra-thin layer of alkaline earth metal have a significant advantage in device lifetime in comparison with those employing alloys of low work function metal, such as alkaline earth metals, with more stable metals, the latter being known in the art. Furthermore, this comparative example demonstrates that the improvements resulting from the use of the ultra-thin layer of alkaline earth metals are not the result of inadvertent alloying with the capping metal.

REFERENCES

The disclosures of the publications, patents, and published patent specifications referenced below are hereby incorporated by reference into the present disclosure to more fully describe the state of the art to which this invention pertains.

Berggren et al., 1995, "Controlling Colour by Voltage in Polymer Light Emitting Diodes," Synthetic Metals, Vol. 71, pp. 2185–2186.

Braun et al., 1991, "Visible Light Emission from Semiconducting Polymer Diodes," Appl. Phys. Lett., Vol. 58, pp. 1982–1984.

Braun et al., 1992, "Electroluminescence and Electrical Transport in Poly(3-octylthiophene) Diodes," J. Appl. Phys., Vol. 72, pp. 564–568.

Bredas et al., (editors), 1991, Conjugated Polymers (Kluwer Academic Publishers, Dordrecht, Netherlands).

Burroughs et al., 1990, "Light-Emitting Diodes Based on Conjugated Polymers," Nature, Vol. 347, pp. 539–541.

Cao et al., 1997, "Optical Quality Transparent Conductors," U.S. Pat. No. 5,626,795, issued May 06, 1997.

Dean, editor, 1982, Lange's Handbook of Chemistry, 4th edition (MacGraw-Hill Inc., New York).

Friend et al., 1993, "Electroluminescent Devices," U.S. Pat. No. 5,247,190, issued Sep. 21, 1993.

Greenham et al., 1993, "Efficient Light-Emitting Diodes Based on Polymers with High Electron Affinities," Nature, Vol. 365, pp. 628–630.

Grem et al., 1992, "Realization of a Blue-Light-Emitting Device Using Poly(p-Phenylene)," *Advanced Materials*, Vol. 4, pp. 36–37.

Gustafsson et al., 1992, "Flexible Light-Emitting Diodes Made From Soluble Conducting Polymers," *Nature*, Vol. 357, pp. 477–479.

Heeger et al., 1995, "Visible Light Emitting Diodes Fabricated From Soluble Semiconducting Polymers," U.S. Pat. No. 5,408,109, issued Apr. 18, 1995.

Holmes et al., 1996, "Semiconductive Copolymers for use in Luminescent Devices," U.S. Pat. No. 5,512,654, issued Apr. 30, 1996.

Kido et al., 1995, "Single-Layer White Light-Emitting Organic Electroluminescent Devices Based on Dye-Dispersed Poly(N-vinylcarbazole)," *Appl. Phys. Lett.*, Vol. 67, pp. 2281–2283.

Nakano et al., 1994, "Organic Electroluminescent Device," U.S. Pat. No. 5,317,169, issued May 31, 1994.

Parker et al., 1994, "Fabrication of Polymer Light-Emitting Diodes Using Doped Silicon Electrodes," *Appl. Phys. Lett.*, Vol. 64, pp. 1774–1776.

Parker et al., 1994a, "Carrier Tunneling and Device Characteristics in Polymer Light-Emitting Diodes," *J. Appl. Phys.*, Vol. 75, pp. 1656–1666.

Parker et al., 1994b, "Efficient Blue Electroluminescence From a Fluorinated Polyquinone," *Appl. Phys. Lett.*, Vol. 65, No. 10, pp. 1272–1274.

Salaneck et al., 1996, in *Conjugated Polymer Surfaces and Interfaces* (Cambridge University Press, Cambridge), pp. 106–108.

Scott et al., 1996, "Degradation and Failure of MEH-PPV Light-Emitting Diodes," *J. Appl. Phys.*, Vol. 79, pp. 2745–2751.

Skotheim, editor, 1986, *Handbook of Conducting Polymers, Volumes 1 and 2* (Marcel Dekker, Inc., New York).

Vanslyke et al., 1991, "Electroluminescent Device with Improved Cathode," U.S. Pat. No. 5,059,862, issued Oct. 22, 1991.

Vanslyke, 1991, "Organic Electroluminescent Device with Stabilized Cathode," U.S. Pat. No. 5,047,687, issued Sep. 10, 1991.

Vanslyke, 1992, "Blue Emitting Internal Junction Organic Electroluminescent Device (I)," U.S. Pat. No. 5,151,629, issued Sep. 29, 1992.

Wudl et al., 1993, "Conducting Polymer formed of Poly(2-methoxy,5-(2'-ethyl-hexyloxy)-p-Phenylenevinylene)," U.S. Pat. No. 5,189,136, issued Feb. 23, 1993.

Yang et aL, 1993, "A Soluble Blue-Light-Emitting Polymer," *Macromolecules*, Vol. 26, pp. 1188–1190.

Yang et al., 1994, "Polyaniline as a Transparent Electrode for Polymer Light-Emitting Diodes: Lower Operating Voltage and Higher Efficiency," *Appl. Phys. Lett.*, Vol. 64, pp. 1245–1247.

Yang et al., 1995, "Enhanced Performance of Polymer Light-Emitting Diodes Using High-Surface Area Polyaniline Network Electrodes," *J. Appl. Phys.*, Vol. 77, pp. 694–698.

Yang, 1995, "Bilayer Composite Electrodes for Diodes," published international patent application number WO 95/24056, published Sep. 08, 1995.

Yu, 1996, "High Performance Photonic Devices Made with Semiconducting Polymers," *Synthetic Metals*, Vol. 80, pp. 143–150.

Zhang et al., 1993, "Yellow Electroluminescent Diodes Utilizing Poly(2,5-bis(cholestanosy)-1,4-phenylene vinylene)," *J. Electron. Mater.*, Vol. 22, pp. 413–417.

Zhang et al., 1994, "Blue Electroluminescent Diodes Utilizing Blends of Poly(p-Phenylene Vinylene) in Poly(9-Vinylcarbazole)," *Synthetic Metals*, Vol. 62, pp. 35–40.

What is claimed is:

1. A polymer light-emitting diode comprising:
   (a) a transparent hole-injecting anode layer;
   (b) an emissive layer comprising an electroluminescent polymer; and,
   (c) an electron-injecting cathode layer;
   wherein said cathode layer comprises an ultra-thin layer of alkaline earth metal having a thickness of from about 30 to about 60 Å.

2. The polymer light-emitting diode according to claim 1, wherein said alkaline earth metal is selected from the group consisting of calcium, strontium, and barium.

3. The polymer light-emitting diode according to claim 1, wherein said cathode layer further comprises a capping layer.

4. The polymer light-emitting diode according to claim 2, wherein said cathode layer further comprises a capping layer.

5. The polymer light-emitting diode according to claim 3, wherein said capping layer comprises aluminum, silver, or copper.

6. The polymer light-emitting diode according to claim 1, wherein said electroluminescent polymer is a conjugated polymer.

7. The polymer light-emitting diode according to claim 2, wherein said electroluminescent polymer is a conjugated polymer.

8. The polymer light-emitting diode according to claim 1, wherein said electroluminescent polymer is selected from the group consisting of: poly(p-phenylene vinylene)s, poly (arylene vinylene)s, poly(p-phenylene)s, poly(arylene)s, and polyquinolines.

9. The polymer light-emitting diode according to claim 2, wherein said electroluminescent polymer is selected from the group consisting of. poly(p-phenylene vinylene)s, poly (arylene vinylene)s, poly(p-phenylene)s, poly(arylene)s, and polyquinolines.

10. The polymer light-emitting diode according to claim 1, wherein said electroluminescent polymer is poly(2-(3,7-dimethyloctyloxy)-5-methoxy-1,4-phenylene vinylene).

11. The polymer light-emitting diode according to claim 1, wherein said anode layer comprises a material selected from the group consisting of: metal, metal oxide, graphite, doped inorganic semiconductor, doped conjugated polymer.

12. The polymer light-emitting diode according to claim 1, wherein said anode layer comprises a material selected from the group consisting of: aluminum, silver, platinum, gold, palladium, tungsten, indium, copper, iron, nickel, zinc, lead, tin oxide, indium/tin oxide, graphite, doped silicon, doped germanium, doped gallium arsenide, doped polyaniline, doped polypyrrole, and doped polythiophene.

13. The polymer light-emitting diode according to claim 1, wherein said polymer light-emitting diode is encapsulated.

14. The polymer light-emitting diode according to claim 2, wherein said electroluminescent polymer is poly(2-(3,7-dimethyloctyloxy)-5-methoxy-1,4-phenylene vinylene).

15. The polymer light-emitting diode according to claim 2, wherein said anode layer comprises a material selected from the group consisting of: metal, metal oxide, graphite, doped inorganic semiconductor, doped conjugated polymer.

16. The polymer light-emitting diode according to claim 2, wherein said anode layer comprises a material selected from the group consisting of: aluminum, silver, platinum, gold, palladium, tungsten, indium, copper, iron, nickel, zinc, lead, tin oxide, indium/tin oxide, graphite, doped silicon, doped germanium, doped gallium arsenide, doped polyaniline, doped polypyrrole, and doped polythiophene.

17. The polymer light-emitting diode according to claim 2, wherein said polymer light-emitting diode is encapsulated.

18. A polymer light-emitting diode comprising:
(a) a transparent hole-injecting anode layer;
(b) an emissive layer comprising an electroluminescent polymer; and,
(c) an electron-injecting cathode layer;
wherein said cathode layer comprises an ultra-thin layer of alkaline earth metal having a thickness of from about 30 to about 40 Å.

19. The polymer light-emitting diode according to claim 18, wherein said alkaline earth metal is selected from the group consisting of calcium, strontium, and barium.

20. The polymer light-emitting diode according to claim 18, wherein said cathode layer further comprises a capping layer.

21. The polymer light-emitting diode according to claim 19, wherein said cathode layer further comprises a capping layer.

22. The polymer light-emitting diode according to claim 20, wherein said capping layer comprises aluminum, silver, or copper.

23. The polymer light-emitting diode according to claim 18, wherein said electroluminescent polymer is a conjugated polymer.

24. The polymer light-emitting diode according to claim 19, wherein said electroluminescent polymer is a conjugated polymer.

25. The polymer light-emitting diode according to claim 18, wherein said electroluminescent polymer is selected from the group consisting of: poly(p-phenylene vinylene)s, poly(arylene vinylene)s, poly(p-phenylene)s, poly(arylene)s, and polyquinolines.

26. The polymer light-emitting diode according to claim 19, wherein said electroluminescent polymer is selected from the group consisting of: poly(p-phenylene vinylene)s, poly(arylene vinylene)s, poly(p-phenylene)s, poly(arylene)s, and polyquinolines.

27. The polymer light-emitting diode according to claim 18, wherein said electroluminescent polymer is poly(2-(3,7-dimethyloctyloxy)-5-methoxy-1,4-phenylene vinylene).

28. The polymer light-emitting diode according to claim 18, wherein said anode layer comprises a material selected from the group consisting of: metal, metal oxide, graphite, doped inorganic semiconductor, doped conjugated polymer.

29. The polymer light-emitting diode according to claim 18, wherein said anode layer comprises a material selected from the group consisting of: aluminum, silver, platinum, gold, palladium, tungsten, indium, copper, iron, nickel, zinc, lead, tin oxide, indium/tin oxide, graphite, doped silicon, doped germanium, doped gallium arsenide, doped polyaniline, doped polypyrrole, and doped polythiophene.

30. The polymer light-emitting diode according to claim 18, wherein said polymer light-emitting diode is encapsulated.

31. A polymer light-emitting diode comprising:
(a) a transparent hole-injecting anode layer;
(b) an emissive layer comprising an electroluminescent polymer; and,
(c) an electron-injecting cathode layer;
wherein said cathode layer comprises an ultra-thin layer of calcium having a thickness of from about 15 to about 80 Å.

32. The polymer light-emitting diode according to claim 31, wherein said cathode layer further comprises a capping layer.

33. The polymer light-emitting diode according to claim 32, wherein said capping layer comprises aluminum, silver, or copper.

34. The polymer light-emitting diode according to claim 31, wherein said electroluminescent polymer is a conjugated polymer.

35. The polymer light-emitting diode according to claim 31, wherein said electroluminescent polymer is selected from the group consisting of: poly(p-phenylene vinylene)s, poly(arylene vinylene)s, poly(p-phenylene)s, poly(arylene)s, and polyquinolines.

36. The polymer light-emitting diode according to claim 31, wherein said electroluminescent polymer is poly(2-(3,7-dimethyloctyloxy)-5-methoxy-1,4-phenylene vinylene).

37. The polymer light-emitting diode according to claim 31, wherein said anode layer comprises a material selected from the group consisting of: metal, metal oxide, graphite, doped inorganic semiconductor, doped conjugated polymer.

38. The polymer light-emitting diode according to claim 31, wherein said anode layer comprises a material selected from the group consisting of: aluminum, silver, platinum, gold, palladium, tungsten, indium, copper, iron, nickel, zinc, lead, tin oxide, indium/tin oxide, graphite, doped silicon, doped germanium, doped gallium arsenide, doped polyaniline, doped polypyrrole, and doped polythiophene.

39. The polymer light-emitting diode according to claim 31, wherein said polymer light-emitting diode is encapsulated.

40. A polymer light-emitting diode comprising:
(a) a transparent hole-injecting anode layer;
(b) an emissive layer comprising an electroluminescent polymer; and,
(c) an electron-injecting cathode layer;
wherein said cathode layer comprises an ultra-thin layer of calcium having a thickness of from about 15 to about 60 Å.

41. The polymer light-emitting diode according to claim 40, wherein said cathode layer further comprises a capping layer.

42. The polymer light-emitting diode according to claim 41, wherein said capping layer comprises aluminum, silver, or copper.

43. The polymer light-emitting diode according to claim 40, wherein said electroluminescent polymer is a conjugated polymer.

44. The polymer light-emitting diode according to claim 40, wherein said electroluminescent polymer is selected from the group consisting of: poly(p-phenylene vinylene)s, poly(arylene vinylene)s, poly(p-phenylene)s, poly(arylene)s, and polyquinolines.

45. The polymer light-emitting diode according to claim 40, wherein said electroluminescent polymer is poly(2-(3,7-dimethyloctyloxy)-5-methoxy-1,4-phenylene vinylene).

46. The polymer light-emitting diode according to claim 40, wherein said anode layer comprises a material selected from the group consisting of: metal, metal oxide, graphite, doped inorganic semiconductor, doped conjugated polymer.

47. The polymer light-emitting diode according to claim 40, wherein said anode layer comprises a material selected from the group consisting of: aluminum, silver, platinum, gold, palladium, tungsten, indium, copper, iron, nickel, zinc, lead, tin oxide, indium/tin oxide, graphite, doped silicon, doped germanium, doped gallium arsenide, doped polyaniline, doped polypyrrole, and doped polythiophene.

48. The polymer light-emitting diode according to claim 40, wherein said polymer light-emitting diode is encapsulated.

49. A polymer light-emitting diode comprising:
(a) a transparent hole-injecting anode layer;
(b) an emissive layer comprising an electroluminescent polymer; and,
(c) an electron-injecting cathode layer;
wherein said cathode layer comprises an ultra-thin layer of calcium having a thickness of from about 30 to about 60 Å.

50. The polymer light-emitting diode according to claim 49, wherein said cathode layer further comprises a capping layer.

51. The polymer light-emitting diode according to claim 50, wherein said capping layer comprises aluminum, silver, or copper.

52. The polymer light-emitting diode according to claim 49, wherein said electroluminescent polymer is a conjugated polymer.

53. The polymer light-emitting diode according to claim 49, wherein said electroluminescent polymer is selected from the group consisting of: poly(p-phenylene vinylene)s, poly(arylene vinylene)s, poly(p-phenylene)s, poly(arylene)s, and polyquinolines.

54. The polymer light-emitting diode according to claim 49, wherein said electroluminescent polymer is poly(2-(3, 7-dimethyloctyloxy)-5-methoxy-1,4-phenylene vinylene).

55. The polymer light-emitting diode according to claim 49, wherein said anode layer comprises a material selected from the group consisting of: metal, metal oxide, graphite, doped inorganic semiconductor, doped conjugated polymer.

56. The polymer light-emitting diode according to claim 49, wherein said anode layer comprises a material selected from the group consisting of: aluminum, silver, platinum, gold, palladium, tungsten, indium, copper, iron, nickel, zinc, lead, tin oxide, indium/tin oxide, graphite, doped silicon, doped germanium, doped gallium arsenide, doped polyaniline, doped polypyrrole, and doped polythiophene.

57. The polymer light-emitting diode according to claim 49, wherein said polymer light-emitting diode is encapsulated.

58. A polymer light-emitting diode comprising:
(a) a transparent hole-injecting anode layer;
(b) an emissive layer comprising an electroluminescent polymer; and,
(c) an electron-injecting cathode layer;
wherein said cathode layer comprises an ultra-thin layer of barium having a thickness of from about 15 to about 85 Å.

59. The polymer light-emitting diode according to claim 58, wherein said cathode layer further comprises a capping layer.

60. The polymer light-emitting diode according to claim 59, wherein said capping layer comprises aluminum, silver, or copper.

61. The polymer light-emitting diode according to claim 58, wherein said electroluminescent polymer is a conjugated polymer.

62. The polymer light-emitting diode according to claim 58, wherein said electroluminescent polymer is selected from the group consisting of: poly(p-phenylene vinylene)s, poly(arylene vinylene)s, poly(p-phenylene)s, poly(arylene)s, and polyquinolines.

63. The polymer light-emitting diode according to claim 58, wherein said electroluminescent polymer is poly(2-(3, 7-dimethyloctyloxy)-5-methoxy-1,4-phenylene vinylene).

64. The polymer light-emitting diode according to claim 58, wherein said anode layer comprises a material selected from the group consisting of: metal, metal oxide, graphite, doped inorganic semiconductor, doped conjugated polymer.

65. The polymer light-emitting diode according to claim 58, wherein said anode layer comprises a material selected from the group consisting of: aluminum, silver, platinum, gold, palladium, tungsten, indium, copper, iron, nickel, zinc, lead, tin oxide, indium/tin oxide, graphite, doped silicon, doped germanium, doped gallium arsenide, doped polyaniline, doped polypyrrole, and doped polythiophene.

66. The polymer light-emitting diode according to claim 58, wherein said polymer light-emitting diode is encapsulated.

67. A polymer light-emitting diode comprising:
(a) a transparent hole-injecting anode layer;
(b) an emissive layer comprising an electroluminescent polymer; and,
(c) an electron-injecting cathode layer;
wherein said cathode layer comprises an ultra-thin layer of barium having a thickness of from about 15 to about 60 Å.

68. The polymer light-emitting diode according to claim 67, wherein said cathode layer further comprises a capping layer.

69. The polymer light-emitting diode according to claim 68, wherein said capping layer comprises aluminum, silver, or copper.

70. The polymer light-emitting diode according to claim 67, wherein said electroluminescent polymer is a conjugated polymer.

71. The polymer light-emitting diode according to claim 67, wherein said electroluminescent polymer is selected from the group consisting of: poly(p-phenylene vinylene)s, poly(arylene vinylene)s, poly(p-phenylene)s, poly(arylene)s, and polyquinolines.

72. The polymer light-emitting diode according to claim 67, wherein said electroluminescent polymer is poly(2-(3, 7-dimethyloctyloxy)-5-methoxy-1,4-phenylene vinylene).

73. The polymer light-emitting diode according to claim 67, wherein said anode layer comprises a material selected from the group consisting of: metal, metal oxide, graphite, doped inorganic semiconductor, doped conjugated polymer.

74. The polymer light-emitting diode according to claim 67, wherein said anode layer comprises a material selected from the group consisting of: aluminum, silver, platinum, gold, palladium, tungsten, indium, copper, iron, nickel, zinc, lead, tin oxide, indium/tin oxide, graphite, doped silicon, doped germanium, doped gallium arsenide, doped polyaniline, doped polypyrrole, and doped polythiophene.

75. The polymer light-emitting diode according to claim 67, wherein said polymer light-emitting diode is encapsulated.

76. A polymer light-emitting diode comprising:
(a) a transparent hole-injecting anode layer;
(b) an emissive layer comprising an electroluminescent polymer; and,
(c) an electron-injecting cathode layer;
wherein said cathode layer comprises an ultra-thin layer of barium having a thickness of from about 30 to about 60 Å.

77. The polymer light-emitting diode according to claim 76, wherein said cathode layer further comprises a capping layer.

78. The polymer light-emitting diode according to claim 77, wherein said capping layer comprises aluminum, silver, or copper.

79. The polymer light-emitting diode according to claim 76, wherein said electroluminescent polymer is a conjugated polymer.

80. The polymer light-emitting diode according to claim 76, wherein said electroluminescent polymer is selected from the group consisting of: poly(p-phenylene vinylene)s, poly(arylene vinylene)s, poly(p-phenylene)s, poly(arylene)s, and polyquinolines.

81. The polymer light-emitting diode according to claim 76, wherein said electroluminescent polymer is poly(2-(3,7-dimethyloctyloxy)-5-methoxy-1,4-phenylene vinylene).

82. The polymer light-emitting diode according to claim 76, wherein said anode layer comprises a material selected from the group consisting of: metal, metal oxide, graphite, doped inorganic semiconductor, doped conjugated polymer.

83. The polymer light-emitting diode according to claim 76, wherein said anode layer comprises a material selected from the group consisting of: aluminum, silver, platinum, gold, palladium, tungsten, indium, copper, iron, nickel, zinc, lead, tin oxide, indium/tin oxide, graphite, doped silicon, doped germanium, doped gallium arsenide, doped polyaniline, doped polypyrrole, and doped polythiophene.

84. The polymer light-emitting diode according to claim 76, wherein said polymer light-emitting diode is encapsulated.

* * * * *